United States Patent [19]

Armstrong

[11] 4,062,699
[45] Dec. 13, 1977

[54] METHOD FOR FABRICATING DIFFUSION SELF-ALIGNED SHORT CHANNEL MOS DEVICE

[75] Inventor: William Eddie Armstrong, Mission Viejo, Calif.

[73] Assignee: Western Digital Corporation, Newport Beach, Calif.

[21] Appl. No.: 659,677

[22] Filed: Feb. 20, 1976

[51] Int. Cl.² .................... H01L 21/265; H01L 29/78
[52] U.S. Cl. ......................... 148/1.5; 29/571; 148/187; 357/41; 357/42; 357/91
[58] Field of Search ................ 148/1.5, 187; 357/41, 357/42, 91; 29/571

[56] References Cited

U.S. PATENT DOCUMENTS

| | | | |
|---|---|---|---|
| 3,756,861 | 9/1973 | Payne et al. | 148/1.5 |
| 3,775,191 | 11/1973 | McQuhae | 148/1.5 |
| 3,793,088 | 2/1974 | Eckton, Jr. | 148/1.5 |
| 3,845,495 | 10/1974 | Cauge et al. | 148/187 X |
| 3,895,390 | 7/1975 | Meiling et al. | 357/91 X |
| 3,909,320 | 9/1975 | Cauge et al. | 148/187 |
| 3,924,265 | 12/1975 | Rodgers | 148/1.5 X |
| 3,933,529 | 1/1976 | Goser | 148/1.5 |
| 3,988,761 | 10/1976 | Kanazawa | 357/41 |
| 4,007,478 | 2/1977 | Yagi | 357/41 |

OTHER PUBLICATIONS

Chou, "Self-Registered Si Electrode FET," IBM Tech. Discl. Bull., vol. 14, No. 1, June, 1971, p. 250.

*Primary Examiner*—L. Dewayne Rutledge
*Assistant Examiner*—W. G. Saba
*Attorney, Agent, or Firm*—Spensley, Horn & Lubitz

[57] ABSTRACT

A diffusion self-aligned, short channel device may be fabricated by ion implantation of an n-type channel region within a p-type substrate. A p-type dopant is then implanted in and driven through a portion of the n-type channel region to form an impurity region. A diffusion self-aligned n-type channel region is then disposed in the p-type impurity region and in the n-type channel region. The method allows for the simultaneous fabrication of a channel implanted MOSFET as well as a standard MOSFET. The resulting diffusion self-aligned, short channel device is a high gain, high speed small device which can be simply combined and fabricated with channel-implanted depletion devices and low body effect devices in an integrated circuit.

5 Claims, 15 Drawing Figures

Fig. 4
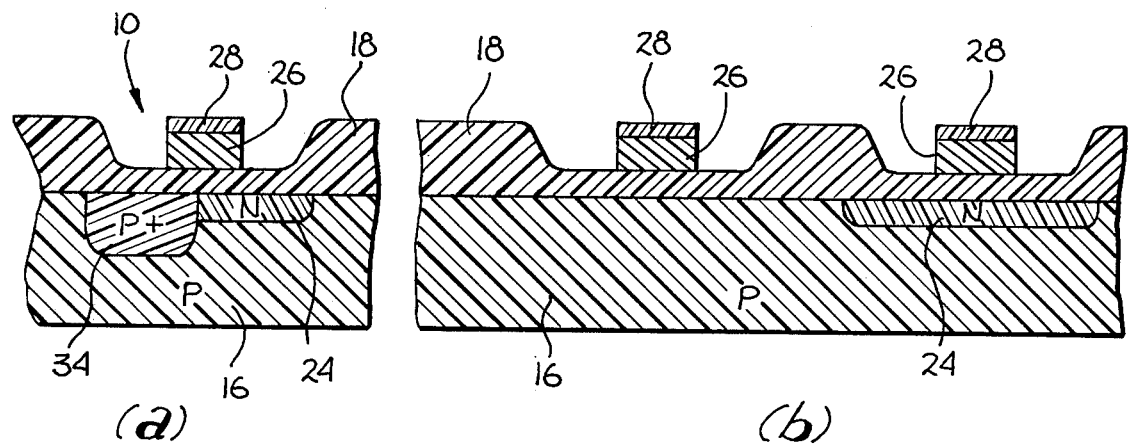
(a)   (b)
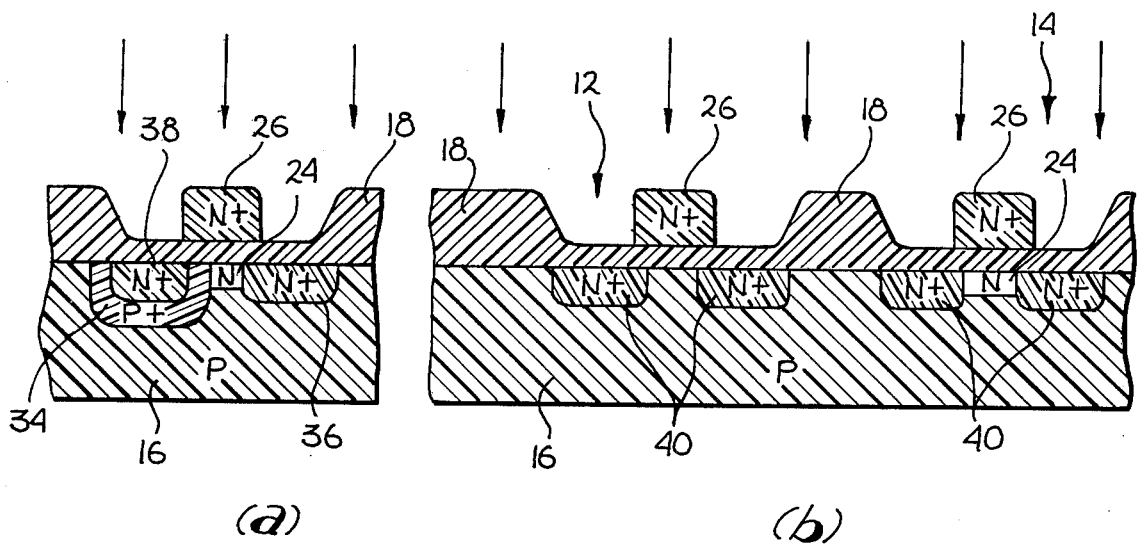
(a)   (b)
Fig. 5

METHOD FOR FABRICATING DIFFUSION SELF-ALIGNED SHORT CHANNEL MOS DEVICE

BACKGROUND OF THE INVENTION

1. Field of the Invention

The present invention relates to the method of fabrication of diffusion self-aligned, short channel MOS devices, including a method for simultaneous fabrication of depletion MOS devices and low body effect MOS devices, and further relates to diffusion self-aligned, short channel devices resulting from such method.

2. Discussion of the Prior Art

High gain, high speed diffusion self-aligned, short channel MOS devices may be fabricated by ion implanting a heavily doped p-type region within a lightly doped p-type substrate. One of the n-type active diffusion regions is then disposed within the p-type impurity region or well. By this means the effective channel width of a MOSFET may be accurately controlled according to the extent of the p-type impurity region below the gate electrode. Examples of this type of device are disclosed in Gauge et al, U.S. Pat. No. 3,909,320 and U.S. Pat. No. 3,845,495. While the diffusion self-aligned MOS transistor has a higher gain factor than the standard MOS device, it is possible to substantially increase the gain factor of a diffusion self-aligned MOS device by the improvements disclosed below. Furthermore, where a diffusion self-aligned MOS transistor has been combined in integrated circuitry with a depletion device, the prior art has found it necessary to follow the fabrication of a standard MOSFET with a channel implantation in order to obtain acceptable circuit speeds. An example of this necessity is illustrated in the prior art in Ohta et al, "A High-Speed Logic LSI Using Diffusion Self-Aligned Enhancement Depletion MOS IC," IEEE Journal of Solid-State Circuits, Vol. SC-10, No. 5, pp. 315, 317 (October 1975). The prior art channel implantation step, used to decrease the propagation delay time of an inverter circuit, results in a method of fabrication which increases the complexity and difficulty of fabrication by introducing one or more additional masking steps. Moreover, the efficiency of the diffusion self-aligned device in the inverter circuit may easily be affected by the subsequent ion implantation step.

What is needed, then, is a means for improving the performance of a diffusion self-aligned, short channel device in such a manner that the complexity and difficulty of its method of fabrication is not increased and such that accompanying depletion MOS devices and low body effect MOS devices may be easily and simultaneously fabricated on the same integrated circuit chip.

BRIEF SUMMARY OF THE INVENTION

An improved diffusion, self-aligned, short channel device may be fabricated in a semiconductor substrate having a first conductivity type and having at least a first insulating layer disposed thereon by a method comprised of the following steps. A first dopant is selectively disposed into the upper portion of the semiconductor substrate and at least one location to form a channel region. The first dopant has a conductivity type opposite to that of the semiconductor substrate. A gate member is selectively disposed on the first insulating layer. A second dopant is then selectively disposed into a selected portion of the channel region to form an impurity region. The impurity region extends into the semiconductor substrate more deeply than the channel region and extends beneath the gate member. The impurity region has the same conductivity type as the semiconductor substrate but has a greater impurity concentration than the semiconductor substrate. A third dopant is then selectively disposed into a portion of the impurity region and channel region to form active regions within the semiconductor substrate. One of the active regions is formed entirely within the impurity region. Both active regions have the same conductivity type as the channel region but have a greater impurity concentration than the channel region.

The above method results in a diffusion self-aligned short channel device in a doped semiconductor substrate. A gate oxide layer is disposed on the semiconductor substrate. A conductive gate member is disposed on the gate oxide layer. An impurity region is disposed within the semiconductor substrate and has the same conductivity type as the substrate. A first active region is disposed within the impurity region and a second active region is disposed within the semiconductor substrate. Both active regions are self-aligned with respect to the conductive gate member and have an opposite conductivity type to that of the semiconductor substrate. Finally, a channel region is disposed within the semiconductor substrate adjacent to the gate oxide layer and between the impurity region and the second active region. The channel region has an opposite conductivity type to that of the semiconductor substrate.

The disclosed methodology and device structure is particularly adapted to the simultaneous fabrication of one or more MOS devices in a single integrated circuit chip, wherein the devices include a diffusion self-aligned short channel device, a low body effect device, and a depletion device.

BRIEF DESCRIPTION OF THE DRAWINGS

The fabrication of a channel region in a substrate having at least one insulating layer thereon is illustrated for a diffusion self-aligned, short channel device in FIG. 1(a) and for a depletion device in FIG. 1(b).

FIG. 2(b) illustrates that the low body effect device and depletion device are completely masked by the first masking layer. The semiconductor substrate corresponding to the diffusion self-aligned, short channel device is selectively doped by the masking configuration of FIG. 2.

Figure 3:
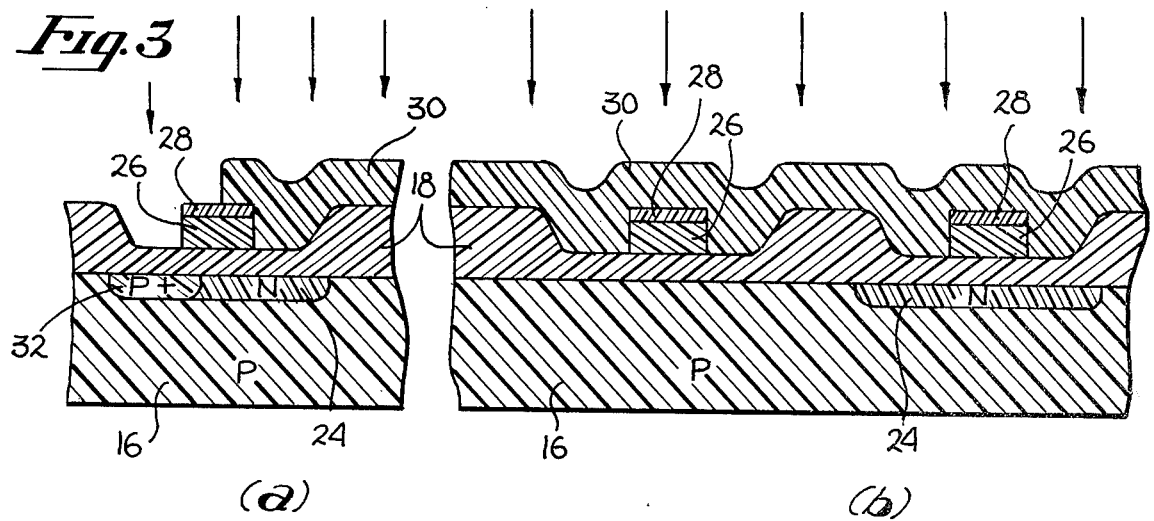

The first masking layer is removed and a dopant implanted in FIG. 3(a), said remaining masking layer preventing any implantation as shown in 3(b), and is further driven into the semiconductor substrate as shown in FIGS. 4(a) and 4(b).

FIG. 5 illustrates that the gate masking layer is removed and the active regions are disposed in the diffusion self-aligned, short channel device of FIG. 5(a) and the low body effect and depletion devices of FIG. 5(b).

DETAILED DESCRIPTION OF THE PREFERRED EMBODIMENTS

The present invention is an improved diffusion self-aligned, short channel device and a method for making the same which enables the fabricator to easily and simultaneously fabricate other MOS devices in the same integrated circuit chip, such as a low body effect device and a depletion device. The improved diffusion self-aligned, short channel device (hereinafter referred to as the DSA device) is particularly characterized as having a doped channel region, and as achieving higher gain factors than prior art devices. A method of fabrication of the improved DSA device is characterized by the initial formation of a channel region within the semiconductor substrate. By forming the channel region as one of the initial steps in the process, depletion devices may be simultaneously and conveniently fabricated on the same chip with the DSA device, without entailing numerous additional masking steps and without interfering with the efficiency or performance of the DSA device. As a result, high gain, high speed circuitry may be fabricated on an integrated circuit chip with greater ease and economy than previously known to the prior art. Moreover, the resulting DSA devices are characterized by higher performance than the prior art.

Figure 1:
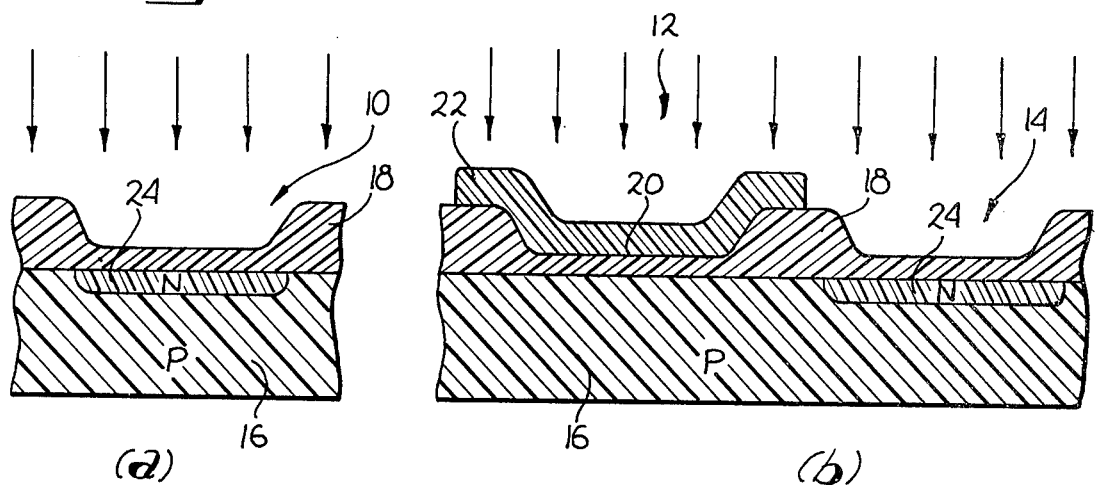
FIG. 1(a) illustrates that the first masking layer defines an opening exposing a portion of the gate oxide layer in the diffusion self-aligned, short channel device.
Figure 2:
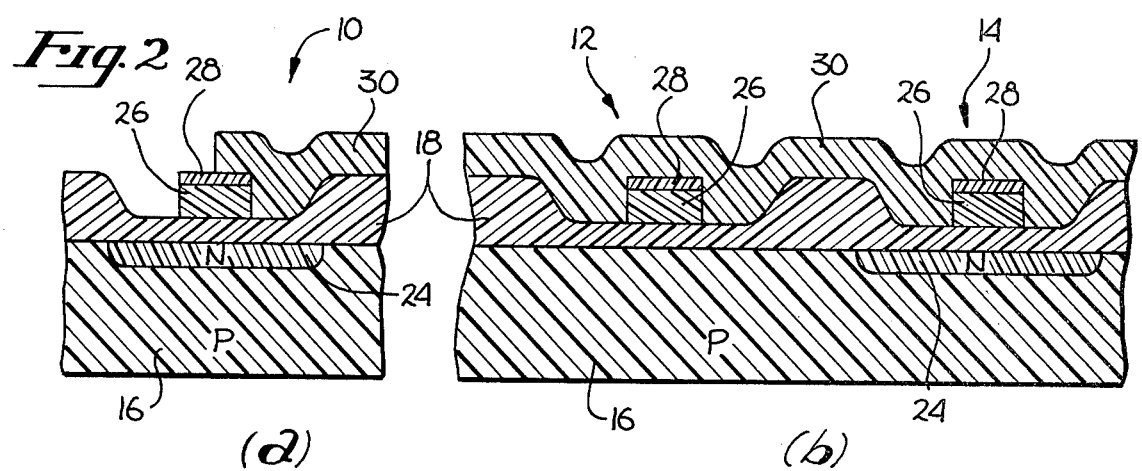
FIG. 2 illustrates the selective deposition of a gate member upon the gate oxide of the substrate, a gate masking layer is left intact, and a first masking layer disposed on the substrate.

The present invention and its various embodiments may be better understood by viewing FIGS. 1–5 and in particular by viewing FIG. 1. FIGS. 1–5 have been subdivided into subgroups (a) and (b). The DSA device 10, fabricated according to the steps illustrated in FIGS. 1(a) – 5(a), may be simultaneously or separately fabricated from the low body effect device 12 or depletion device 14, fabricated according to the steps illustrated in FIGS. 1(b) – 5(b).

A doped semiconductor substrate, having one or more insulating layers disposed thereon by means well known to the art, is prepared. For the purposes of illustration, a lightly doped monocrystalline silicon substrate, well known to the art, is provided as the situs for the active regions of the integrated circuit devices. In the preferred embodiment, substrate 16 is a p type, lightly doped, of $\pi$ substrate having an impurity concentration of the order of $10^{13} - 10^{14}$ cm$^{-3}$. It is to be understood that any other type of semiconductor substrate well known to the art may be employed, such as epitaxial semiconductor layers disposed on monocrystalline semiconductor or sapphire substrates. Typically, one or more insulating layers may then be disposed on substrate 16. For the purposes of illustration, a single insulating layer 18, having variable thickness, is shown in FIGS. 1(a) and 1(b). The thinner portion of insulating layer 18 is the gate oxide layer of the devices to be formed within substrate 16. The thicker portions of insulating layer 18 may include portions of one or more passivating layers, well known to the art, which are disposed on the integrated circuit chip. The prepared substrate 16 of FIGS. 1(a) and (b) are selectively masked by standard means such that selected gate oxide locations 20, such as correspond to low body effect devices 12, are covered by a first masking layer 22. In the present embodiment, masking layer 22 is a thick layer of photoresist material which is commonly used and is a well known photolithographic masking process. It is entirely within the scope of the present invention that other masking materials well known to the art, including various oxides, metal and organic compounds, may be used in place of the photoresist layer.

After the selective formation of the first masking layer 22, a dopant is disposed in the upper portion of substrate 16 in FIG. 1(a) and in depletion device 14 in FIG. 1(b). The dopant forms a channel region 24 in DSA device 10 and depletion device 14. Channel region 24 is self-aligned with respect to the gate oxide layer. In the present embodiment, channel region 24 is a shallow n-type arsenic region underlying the gate oxide layer which is formed by ion implantation, according to techniques well known to the art. It is entirely within the scope of the present invention, however, that any other well known means, such as diffusion, may be used to dispose channel region 24 within substrate 16.

After the selective formation of channel region 24 within substrate 16, first masking layer 22 may be removed and gate members 26 disposed upon the gate oxide layer of each of the MOS devices 10–14 to be formed within semiconductor substrate 16. In the present embodiment, gate members 26 are comprised of polycrystalline silicon disposed on insulating layer 18 by means well known to the art. A silicon oxide layer may be thermally grown on polycrystalline gate members 26. Oxide layer 28 may then be photolithographically masked and selected portions removed. Oxide layer 28 thus forms a masking layer for gate members 26. Exposed portions of polycrystalline gate members 26 are removed by chemical etching, thereby forming isolated gate members 26 in each of MOS devices 10–14.

Prepared substrate 16 is selectively masked by a masking layer 30. Masking layer 30 is disposed upon prepared substrate 16 so as to define an opening over a portion of the gate oxide surface of insulating layer 18 in DSA device 10 of FIG. 2(a). As in FIG. 1, in the preferred embodiment masking layer 30 is a thick layer of standard photoresist material.

After the formation of masking layer 30, a dopant is disposed through the gate oxide surface of insulating layer 18 into the underlying portion of channel region 24 of DSA device 10. Masking layer 30 prevents the deposition of the dopant in any part of MOS devices 12 and 14. The disposed dopant forms an impurity region 32 in substrate 16. Impurity region 32 has a conductivity type opposite to channel region 24 and the same as substrate 16. However, the impurity concentration within impurity region 32 is greater than that of substrate 16. In the present embodiment, impurity region 32 is formed by ion implanting boron according to techniques well known in the art.

After the formation of impurity region 32 in DSA device 10, masking layer 30 is removed. The dopant within impurity region 32 is driven more deeply within substrate 16 to form an expanded impurity region 34. Typically, expanded impurity region 34 is created by enlarging impurity region 32 by means of thermal diffusion within substrate 16. Clearly, impurity region 32 is self-aligned with respect to the gate oxide surface of insulating layer 18 and gate member 26. As a consequence of the thermal diffusion of the dopant from impurity region 32, expanded impurity region 34 extends beyond the edges of the gate oxide surface of insulating layer 18 and gate member 26 to a greater extent than ordinarily occurs during normal implantation processes. The expansion of impurity region 32 to form an expanded impurity region 34 has been shown as a substep in FIG. 4(a). However, it is entirely within the scope of the present invention that masking layer 30 may be left intact during the thermal diffusion of impurity region 32, which diffusion could occur simultaneously with the ion implantation of the dopant.

After the formation of expanded impurity region 34, masking layer 28 is removed. Masking layer 28 serves as an effective barrier which prevented the doping of gate member 26 during the doping step illustrated in FIG. 3. After the removal of masking layer 28, a dopant is disposed into each of MOS devices 10-14 in prepared substrate 16. The dopant has a conductivity type opposite to that of substrate 16. In DSA device 10, deposition of the dopant forms a first active region 38 within impurity region 34. A second active region 36 is also formed on the opposing side of gate member 26 in DSA device 10. In the described embodiment, active regions 36 and 38 are n-type ion implantations having an impurity concentration greater than channel region 24. Gate member 26 is simultaneously doped with the formation of active regions 36 and 38. Clearly, active regions 36 and 38 are self-aligned with respect to gate member 26. In the preferred embodiment, polycrystalline silicon gate member 26 becomes heavily n-type doped and serves as a conductive gate electrode. Active regions 40 are simultaneously formed within low body effect device 12 and depletion device 14 along with active regions 36 and 38 in DSA device 10.

FIGS. 5(a) and (b) illustrate an improved diffusion self-aligned, short channel MOS device together with the simultaneous fabrication of MOS devices 12 and 14. It should be noted that channel region 24 is simultaneously formed in DSA device 10 and MOS device 14. The implantation of channel region 24 will improve the gain factor of DSA device 10 and will decrease the propagation delay of MOS device 14. Thus, high gain, high speed integrated circuits, such as an inverter, may be fabricated by the present invention where the load device is a depletion device and the driver device is a DSA device.

It should be further noted that, the gate oxide-substrate interface is never exposed at any step during the process. Thus, the present process is compatible with the retention of contamination-free formation of the gate oxide layer.

Furthermore, depletion device 14 has been fabricated according to the present invention without the introduction of additional masking steps, and without modifying or perturbing the process steps necessary to form DSA device 10, thereby simplifying the accuracy and control of the fabrication of DSA device 10.

In addition to the clear advantages offered by the simplicity of the process described above, it should be noted that the present process results in a doubling of device density, a doubling to tripling of device speed, and a decrease of approximately 4 times in device cost per function as compared to standard, prior art MOS techniques. The improved device performance is due to the implantation of channel region 24 within DSA device 10 and to the ease and simplicity of the presently disclosed process, which enables the fabricator to obtain precise control during each process step. The increase in device density is due to the disclosed process which permits each diffusion or impurity region within substrate 16 to be self-aligned with respect to any other element within the device. The decrease in device cost per function is again due to the ease and simplicity by which one or more MOS type devices may be simultaneously fabricated in a single silicon chip without the introduction of additional masking steps or additional process control criteria.

Although the present invention has been described in connection with a specific embodiment, it is to be understood that further alterations and modifications may be made to each step of disclosed process or structure of the present invention by those having ordinary skill in the art without departing from the spirit and scope of the present invention.

I claim:

1. A method for simultaneously forming at least two types of self-aligned MOS devices in predetermined locations in a doped semiconductor substrate having at least one insulating layer disposed thereon, said types of MOS devices including a diffusion self-aligned, short channel device, a low body effect device and a depletion device, comprising the steps of:

selectively disposing a dopant into the upper portion of said semiconductor substrate to form a channel region in each of said predetermined locations corresponding to said depletion devices and diffusion self-aligned short channel devices, said dopant having a conductivity type opposite to that of said semiconductor substrate;

selectively disposing a layer of semiconductor material on said insulating layer in each of said predetermined locations;

selectively disposing a dopant into a selected portion of each of said channel regions of said diffusion self-aligned short channel devices to form an impurity region in each of said diffusion self-aligned short channel devices, said dopant having the same conductivity type as said semiconductor substrate, said impurity region extending into said semiconductor substrate more deeply than said channel regions and extending beneath said layer of semiconductor material; and selectively disposing a dopant into a portion of each of said channel regions in said predetermined locations corresponding to said depletion devices, into a portion of each of said impurity regions and channel regions in said predetermined locations corresponding to said diffusion self-aligned short channel devices, and into a portion of said semiconductor substrate in said predetermined locations corresponding to said low body effect devices, active regions being formed in each corresponding predetermined location by said dopant, said dopant having an opposite conductivity to that of said semiconductor substrate.

2. The method of claim 1 wherein:

said semiconductor substrate is of monocrystalline silicon having a p-type conductivity;

said channel region is formed by ion implantation by a n-type impurity;

said impurity region has a p-type impurity;

said active regions have a n-type impurity;

said first insulating layer includes a gate oxide layer; and said second insulating layer includes a polycrystalline silicon layer which is doped simultaneously with the formation of said active regions.

3. The method of claim 1 wherein:

said impurity region is formed by ion implantation, said impurity region being extended beneath said insulating layer, layer of semiconductor material and channel region by thermal diffusion.

4. The method of claim 3 wherein:

said layer of semiconductor material is doped simultaneously with the formation of said active regions.

5. A method for simultaneously forming at least two types of a plurality of different types of self-aligned MOS devices in a p-type semiconductor substrate, said types of MOS devices including a short channel device, low body effect device and depletion device, comprising the steps of:

selectively disposing at least a gate oxide layer and insulating layer on said semiconductor substrate, said gate oxide layer defining a plurality of locations within said semiconductor substrate for said MOS devices;

selectively disposing a first masking layer on said locations corresponding to said low body effect devices;

implanting an n-type dopant in the upper portions of said semiconductor substrate in said locations corresponding to said depletion devices and short channel devices to form at least one channel region;

removing said first masking layer;

selectively disposing a masked polycrystalline layer on each location corresponding to said short channel devices, low body effect devices and depletion devices, said polycrystalline layer having a second masking layer disposed thereon;

selectively disposing a third masking layer at least on said gate oxide layer and insulating layer to define an opening exposing a portion of said gate oxide layer in said locations corresponding to said short channel devices;

implanting a p-type dopant through said exposed portions of said gate oxide layer into said underlying channel regions to form a corresponding number of impurity regions;

diffusing said impurity regions in said semiconductor substrate to extend said impurity regions beneath said channel regions and polycrystalline layers;

removing said second and third masking layers; and selectively disposing an n-type dopant in said channel regions in said depletion devices, in said semiconductor substrate, in said low body effect devices, in said channel regions and impurity regions in said short channel devices, and in said polycrystalline layer.

* * * * *